(12) United States Patent
Chiueh et al.

(10) Patent No.: US 11,316,540 B2
(45) Date of Patent: Apr. 26, 2022

(54) METHOD OF DECODING POLAR CODES BASED ON BELIEF PROPAGATION

(71) Applicant: National Taiwan University, Taipei (TW)

(72) Inventors: Tzi-Dar Chiueh, Taipei (TW); Bei-Sheng Su, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 17/023,062

(22) Filed: Sep. 16, 2020

(65) Prior Publication Data
US 2021/0376863 A1 Dec. 2, 2021

(30) Foreign Application Priority Data
May 26, 2020 (TW) ................................ 109117423

(51) Int. Cl.
*H03M 13/45* (2006.01)
*H03M 13/09* (2006.01)
*H03M 13/13* (2006.01)

(52) U.S. Cl.
CPC ......... *H03M 13/458* (2013.01); *H03M 13/09* (2013.01); *H03M 13/13* (2013.01)

(58) Field of Classification Search
CPC ..... H03M 13/458; H03M 13/09; H03M 13/13
See application file for complete search history.

(56) References Cited

U.S. PATENT DOCUMENTS

| 2013/0198584 A1* | 8/2013 | Zhang | H03M 13/1128 714/758 |
| --- | --- | --- | --- |
| 2016/0336967 A1* | 11/2016 | Boutillon | H03M 13/1171 |
| 2018/0131391 A1* | 5/2018 | Kudekar | H03M 13/1125 |
| 2019/0081824 A1* | 3/2019 | Arvinte | H03M 13/2957 |

OTHER PUBLICATIONS

Title: Brief Propagation Decoding of Polar Codes Using Genetic Algorithm, Graduate Institute of Electronics Engineering, National Taiwan University, Taipei, Taiwan 10617) Jan. 14-17, 2020 (Year: 2020).*

(Continued)

*Primary Examiner* — Thien Nguyen
(74) *Attorney, Agent, or Firm* — Muncy, Geissler, Olds & Lowe, P.C.

(57) ABSTRACT

A method of decoding polar codes based on belief propagation includes conventional belief propagation to decode the polar codes first; when a number of iterations exceeds a predefined upper limit and a cyclic redundancy check fails, the method selects log-likelihood ratio vectors of a plurality of R or L messages from a plurality of log-likelihood ratio vectors generated in each of the iterations and generates another set of log-likelihood ratio vectors (referred to as candidate vector group) to be used as initial values of the R or L messages for a subsequent belief propagation to perform belief propagation decoding iterations and cyclic redundancy check again. Whenever a decoding result passes the cyclic redundancy check, the method exits; otherwise, the method iterates the above procedure until a maximum number of candidate vector groups has been reached.

11 Claims, 3 Drawing Sheets

(56) References Cited

OTHER PUBLICATIONS

B. S. Su et al., "Belief Propagation Decoding of Polar Codes Using Genetic Algorithm," Taiwan Telecommunications Annual Symposium, Kaohsiung, Taiwan, Jan. 14-17, 2020, (5 pages).
I. Tal et al., "List Decoding of Polar Codes," IEEE Trans. Inf. Theory, vol. 61, No. 5, pp. 2213-2226, May 2015, (14 pages).
K. Niu et al., "CRC-aided decoding of polar codes," IEEE Commun. Lett., vol. 16, No. 10, pp. 1668-1671, Oct. 2012, (4 pages).
E. Arikan, "Polar codes: A pipelined implementation," in Proc. 4th Int. Symp. on Broad. Commun. ISBC 2010, pp. 11-14, Jul. 2010, (3 pages).
A. Elkelesh et al., "Belief propagation decoding of polar codes on permuted factor graphs," in Proc. IEEE Wireless Commun. Netw. Conf. (WCNC), Apr. 2018, pp. 1-6 (6 pages).
N. Doan et al., "On the decoding of polar codes on permuted factor graphs," Computer Science, arXiv:1806.11195 [cs.IT], Jun. 28, 2018 (6 pages).
A. Elkelesh et al., "Belief propagation list decoding of polar codes," IEEE Commun. Lett., vol. 22, No. 8, pp. 1536-1539, Aug. 2018 (4 pages).
S. Sun et al., "Post-Processing Methods for Improving Coding Gain in Belief Propagation Decoding of Polar Codes," in Proc. of 2017 IEEE Global Communications Conference, pp. 1-6, Dec. 2017 (6 pages).
T. He et al., "Design of Bhattacharyya parameter in the construction of polar codes," in 2011 7th International conference on wireless communications, networking and mobile computing (pp. 1-4). IEEE (Sep. 2011) (3 pages).
P. Trifonov, "Efficient design and decoding of polar codes," IEEE Transactions on Communications, 60(11), 3221-3227, (2012) (7 pages).
G. He et al., "Beta-expansion: A theoretical framework for fast and recursive construction of polar codes," In Globecom 2017-2017 IEEE Global Communications Conference (pp. 1-6). IEEE, (Dec. 2017) (11 pages).

* cited by examiner

METHOD OF DECODING POLAR CODES BASED ON BELIEF PROPAGATION

REFERENCE TO RELATED APPLICATIONS

The present application is based on, and claims priority from, the Taiwanese Republic of China application number 109117423, filed May 26, 2020, the disclosure of which is hereby incorporated by reference herein in its entirety.

BACKGROUND OF THE INVENTION

Field of Invention

The invention relates to a method of decoding polar codes, and more particularly to a method of decoding polar codes based on belief propagation.

Related Art

In 2008, Professor Erdal Arikan of Bilkent University in Turkey invented the polar code. According to mathematical proof, the polar code can achieve the channel capacity of a binary input discrete memoryless channel (BI-DMC) when its code length is infinite and it is decoded by successive cancellation (SC).

In view of this, the polar code has recently been selected by the 3rd generation partnership project (3GPP) as the error correction code for control information in the fifth generation (5G) mobile communication standard. Although decoding by successive cancellation provides a polar decoding solution with low-complexity, the shorter a polar code length, the less obvious is its polarization phenomenon, which makes its block error rate worse than other well-known error correction codes, such as turbo code and low-density parity-check code (LDPC). Therefore, the successive cancellation list (SCL) decoding that can improve the decoding performance of short codes was introduced (see: I. Tal and A. Vardy, "List Decoding of Polar Codes," IEEE Trans. Inf. Theory, vol. 61, no. 5, pp. 2213-2226, May 2015).

Furthermore, verification by cyclic redundancy check (CRC) or other parity check codes enables the successive cancellation list decoder to approach maximum likelihood (ML) decoding performance with negligible additional cost. Due to the low computational complexity and excellent decoding performance, CRC aided successive cancellation list (CA-SCL) decoder is generally regarded as the best decoding algorithm for polar codes refer to K. Niu and K. Chen, "CRC-aided decoding of polar codes," IEEE Commun. Lett., vol. 16, no. 10, pp. 1668-1671, October 2012). However, decoding algorithms based on successive cancellation are successive in nature, which leads to high decoding delay and low throughput due to dependency on previous decision outcomes. As the code length increases, this inherent drawback becomes more and more serious, making decoders based on successive cancellation less desirable.

On the other hand, the inventor of the polar code also proposed another decoding algorithm (see E. Arikan, "Polar codes: A pipelined implementation," in Proc. 4th Int. Symp. on Broad. Commun. ISBC 2010, pp. 11-14, July 2010). This decoder adopts belief propagation (BP), which includes a message delivery process that can be executed in parallel. Therefore, it can avoid the high latency and low throughput problem encountered by the successive cancellation algorithms. However, because the polar code has a relatively high density parity check matrix, it is more prone to the unfavorable looping effect, which makes the performance of the BP based polar decoders not as good as other decoding methods.

In order to overcome this obstacle, many researchers have proposed a variety of methods to improve the performance of belief propagation based polar decoding, such as the following literatures:

1. Elkelesh, M. Ebada, S. Cammerer, and S. T. Brink, "Belief propagation decoding of polar codes on permuted factor graphs," in Proc. IEEE Wireless Commun. Netw. Conf. (WCNC), April 2018, pp. 1-6.
2. N. Doan, S. A. Hashemi, M. Mondelli, and W. J. Gross. (2018). On the decoding of polar codes on permuted factor graphs. [Online]. Available: https://arxiv.org/abs/1806.11195
3. Elkelesh, M. Ebada, S. Cammerer, and S. T. Brink, Belief propagation list decoding of polar codes, IEEE Commun. Lett., vol. 22, no. 8, pp. 1536-1539, August 2018.
4. S. Sun, S. G. Cho, and Z. Zhang, Post-Processing Methods for Improving Coding Gain in Belief Propagation Decoding of Polar Codes, in Proc. of 2017 IEEE Global Communications Conference, December 2017, pp. 16.

With these previous efforts, belief propagation based polar decoders can achieve decoding performance similar to that of the successive cancellation list (SCL) decoders. But their performance is still inferior to that of the cyclic redundancy check aided successive cancellation list (CA-SCL) decoders. In addition, since the density of the polar code parity check matrix is relatively high, it is easy to generate unreliable bits using the traditional belief propagation decoding algorithm, resulting in decoding failure. This means that as the number of belief propagation iterations increases, the decoding error rate may not improve and may even become worse. Therefore, it will generate significant impact to develop a decoding algorithm with moderate complexity, no obvious error floor, and decoding performance close to that of the CA-SCL decoders with medium-sized lists.

SUMMARY OF THE INVENTION

In view of the problems in the prior art, an objective of the present invention is to select a plurality of messages (log-likelihood ratio (LLR) vectors) from R messages in leftmost column of a polar code factor graph or L messages in rightmost column of a polar code factor graph in an iterative belief propagation process after said belief propagation decoding fails; then generate a new set of messages based on the aforementioned messages through a certain procedure; and feed each of the messages in the set to further belief propagation decoding iteration with anticipation that one of the messages will be decoded successfully. Another objective of the invention is that after further belief propagation decoding of all messages in the original set fails again, select a plurality of messages (LLR vectors) again from the R messages in leftmost column of a polar code factor graph when the iteration halts or the L messages in rightmost column of a polar code factor graph when the iteration halts; then generate a new set of messages (LLR vectors) through a certain procedure; and feed each of the messages (LLR vectors) in the set into the belief propagation decoding iteration again. If a new set of messages has been generated for a certain number of times, and no message is decoded successfully by said belief propagation decoding iteration, the LLR vector with the highest fitness score in the iteration process will become the soft decoding output.

According to the objectives of the invention, a method of decoding polar codes based on belief propagation is provided. When the belief propagation decoding fails to decode a polar code, the decoding failure means that after a number of times of iterations is reached, the decoding result still cannot pass the cyclic redundancy check (CRC), and at each iteration an LLR vector with the number of elements equal to the code length will be generated. Under this premise, the method will first check whether an upper limit of the number of times (P) in generating LLR vector set has been reached. If it has not been reached, X LLR vectors will be selected from the previous LLR vector set according to a fitness score as survivor vectors, and Y derivative vectors are derived from the X survivor vectors. These Y candidate vectors are then used as input messages of subsequent belief propagation decoding. If using any of the Y vectors as an initial value for belief propagation decoding and its result passes the cyclic redundancy check successfully, the method exits. If the belief propagation decoding using all Y vectors as initial values fails, a new set of survivor LLR vectors and a new set of derivative LLR vectors will be generated and the above process will continue until the decoding result passes the cyclic redundancy check successfully or the upper limit (P) has been reached.

The derivative vectors derived from the survivor vector group are generated by a mutation method. The mutation method refers to selecting a LLR vector from the survivor vectors, and flipping sign or adjusting magnitude of the log-likelihood ratio of at least one bit of that vector to generate the derivative vector.

The derivative vectors derived from the survivor vector group are generated by a combination method. The combination method refers to selecting a plurality of LLR vectors from the survivor vectors randomly, and generating the derivative vectors by combining the log-likelihood ratios of different bits.

When the upper limit (P) of the number of times of generating the candidate LLR vector set is reached, the last LLR vector with the highest fitness score (the most reliable) is selected and output as the decoding result.

The invention has one or more than one of the following advantages:

1. The improved belief propagation decoding algorithm makes the belief propagation iteration process (decoding process) more effective, and it is possible to find possible solutions in low signal-to-noise ratio (SNR) regions where the traditional belief propagation decoding methods cannot.

2. In regions with high signal-to-noise ratio, the decoding process is not easily dominated by local minimum, so that the error floor phenomenon is not obvious, and the overall decoding performance is improved.

3. It is more likely to reach correct decoding result via exploring a wider codeword space from flipping certain bits in a codeword and recombining the bits from a plurality of codewords in the process of repeated belief propagation.

DETAILED DESCRIPTION OF THE INVENTION

Before describing the detailed technical content of the invention, a brief description of polar codes and belief propagation decoding polar codes will be provided first.

Polar Code:

Polar code is a linear block code and has a generator matrix that can be used to encode a (N, K) polar code, where $G_N = B_N F^{\otimes n}$, N represents the total code length, K represents the number of message bits, $B_N$ represents a bit reversal matrix of size N×N, n=N/2, and $$F = \begin{bmatrix} 1 & 0 \\ 1 & 1 \end{bmatrix}.$$

The encoding process can be expressed as $x = uG_N$, wherein x is a codeword, and vector u contains the message bits and frozen bits. Using the channel polarization phenomenon, the original N independent channels will be converted into N polarized channels effectively. Channel capacity can be used to measure the reliability of each of the polarized channels, and a reliability ranking of all the polarized channels is the so-called polar sequence. The message bits are allocated to the more reliable channels, and the remaining relatively unreliable channel positions will be placed with the constant frozen bits. Note that the encoder and the decoder of a polar code know the positions and values of the frozen bits in advance.

There are many ways to build a polar sequence, such as the Bhattacharyya parameter (please see: S. Zhao, P. Shi, and B. Wang, "Designs of Bhattacharya parameter in the construction of polar codes," in *Proc. of Wireless Communications, Networking and Mobile Computing* (WiCOM), 7th international conference on, Wuhan, September 2011, pp. 1-4.), Gaussian approximation (please see: P. Trifonov, "Efficient design and decoding of polar codes," *IEEE Trans. Commun.*, vol. 60, no. 11, pp. 3221-3227, November 2012.) and β expansion method (please see: G. He, J C Belfiore, I. Land, G. Yang, X. Liu, Y. Chen, R. Li, J. Wang, Y. Ge, R. Zhang, and W. Tong, "β-expansion: A Theoretical Framework for Fast and Recursive Construction of Polar Codes," in *Proc. of IEEE Global Commun. Conf.* (GLOBECOM), December 2017, pp. 1-6)).

In one embodiment of the invention, the polar sequence specified by 3GPP in the 5G standard is used, where the polar sequence is specifically designed for the CA-SCL decoder. Although more and more evidence shows that the polar sequence most suitable for the belief propagation decoder is different from the polar sequence designed based on successive decoding, the method proposed by the invention can still achieve good results in the polar sequence defined in the 5G standard. However, in actual implementation of the invention, a manner of establishing the polar sequence is not limited thereto.

Figure 1:
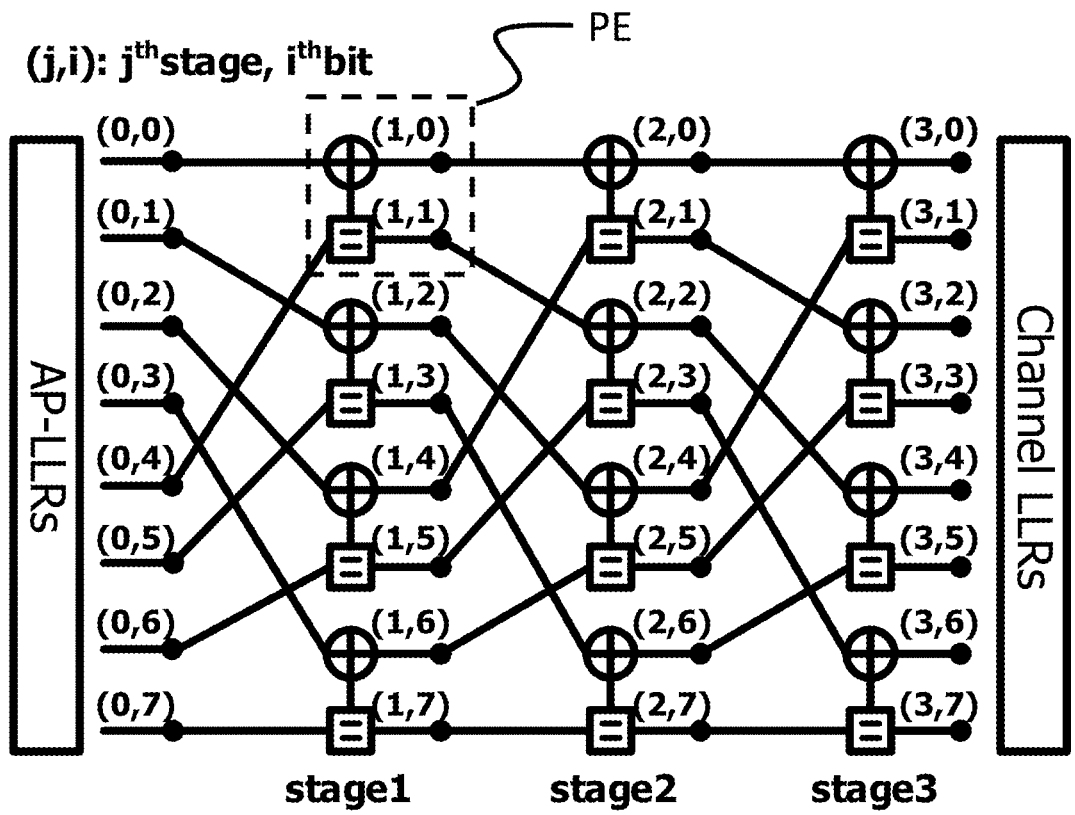
FIG. 1 is a factor graph of an 8-bit polar code.
Figure 2:
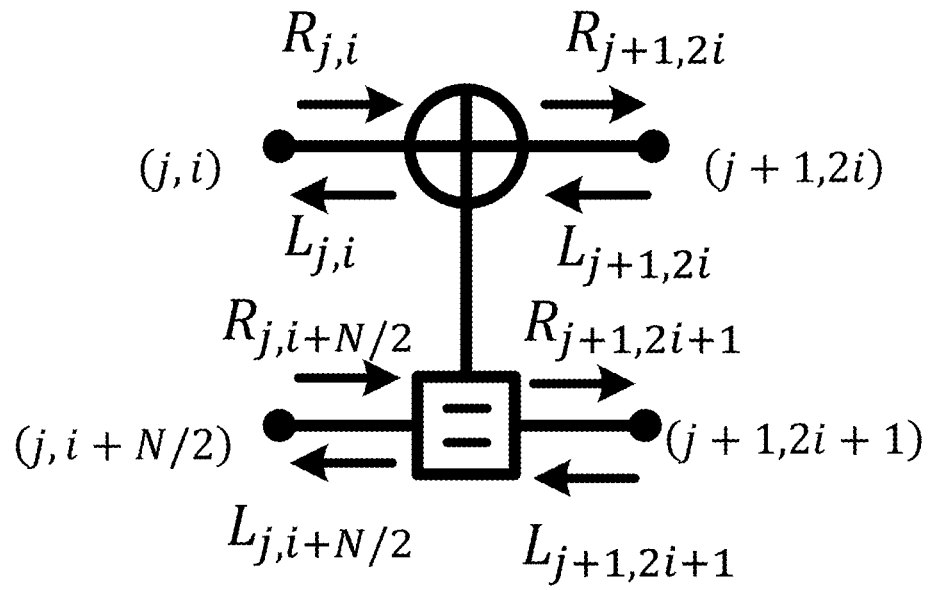
FIG. 2 is a schematic diagram of a processing node in FIG. 1.

Using belief propagation to decode the polar codes:

FIG. 1 is a factor graph of a short polar code (N=8), wherein N represents a code length, (j, i) represents the indices of stage and node in the figure. There are a total of $n=\log_2 N$ stages in FIG. 1, each of which contains N/2 processing elements (PE). The PE structure is shown in FIG. 2. Each PE processes two types of messages, namely L messages and R messages. Each type of the messages contains two distinct messages, wherein the L message ($L_{j,i}$) represents right-to-left messages of the i-th node of the j-th stage, the R message ($R_{j,i}$) represents left-to-right messages of the i-th node of the j-th stage. Message propagation rules in each PE are as follows:

$$L_{j,i} = g\left(L_{j+1,2i}, L_{j+1,2i+1} + R_{j,i+\frac{N}{2}}\right),$$ (1)

$$L_{j,i+\frac{N}{2}} = g(R_{j,i}, L_{j+1,2i}) + L_{j+1,2i+1},$$

$$R_{j+1,2i} = g\left(R_{j,i}, L_{j+1,2i+1} + R_{j,i+\frac{N}{2}}\right),$$

$$R_{j+1,2i+1} = g(R_{j,i}, L_{j+1,2i}) + R_{j,i+N/2},$$

The function $g(x, y) = 2\tan h^{-1}(\tan h(x/2) \tan h(y/2))$ can be further approximated as follows:

$\sigma \cdot \text{sign}(x)\text{sign}(y)\min(|x|,|y|),$ wherein $\sigma$ is a constant x represents $L_{j+1,2i}$ or $R_{j,i}$, and y represents $L_{j+1,2i+1} + R_{j,i+\frac{N}{2}}$ or $L_{j+1,2i}$.

Before the messages are delivered, some of the L messages ($L_{j,i}$) will be initialized by the following formula, $$L_{j,i} = \begin{cases} LLR_i, & j=n \\ 0, & j \neq n \end{cases},$$ (2)

wherein $LLR_i$ represents the a priori log-likelihood ratio of the i-th bit estimated from the channel. Moreover, the R messages ($R_{j,i}$) will be initialized as $$R_{j,i} = \begin{cases} +\infty & j=0, i \in \text{frozen bit} \\ 0, & j \neq 0 \text{ or } j=0, i \notin \text{frozen bit} \end{cases}$$ (3)

It is worth mentioning that in the traditional belief propagation iteration process, L messages ($L_{n,i}$) and R messages ($R_{0,i}$) in the leftmost and the rightmost stages remain unchanged. However, in the invention, the R messages ($R_{0,i}$) in leftmost stage and/or the L messages ($L_{n,i}$) in rightmost stage can be changed. Rules for decoding update are that in each iteration, the R messages ($R_{j,i}$) will be propagated from left to right to update the R messages ($R_{j,i}$) in all stages successively, and then the L messages ($L_{j,i}$) will be propagated from right to left to update the L messages ($L_{j,i}$) in all stages successively. After each iteration is completed, soft decoding results can be obtained on the leftmost stage of the factor graph by $$\gamma_i = \begin{cases} +\infty, & i \in \text{frozen bit} \\ R_{0,i} + L_{0,i} & i \notin \text{frozen bit} \end{cases}$$ (4)

wherein $\gamma_i$ represents a posteriori log-likelihood ratio of the i-th bit.

In order to reduce the decoding delay time, the invention uses the cyclic redundancy check (CRC) defined in the 3GPP 5G standard as a criterion for early termination, that is, to check whether the cyclic redundancy check is passed after each iteration is completed. In fact, this cyclic redundancy check criterion was originally applied to the successive cancellation list polar decoder to select the most probable codeword. In addition to using the cyclic redundancy check to terminate the iterations ahead of time, CRC also help detect the converged errors when erroneous hard decoding output stabilize in the belief propagation process. Once this situation is detected, the iteration is terminated. The present invention applies conditional sign flipping/magnitude adjustment and combination for the R messages ($R_{0,i}$) in leftmost stage or the L messages ($L_{n,i}$) in rightmost stage to generate new R messages in leftmost stage or new L messages in rightmost stage, and then proceeds with the belief propagation to escape from trapping in this error state.

Figure 3:
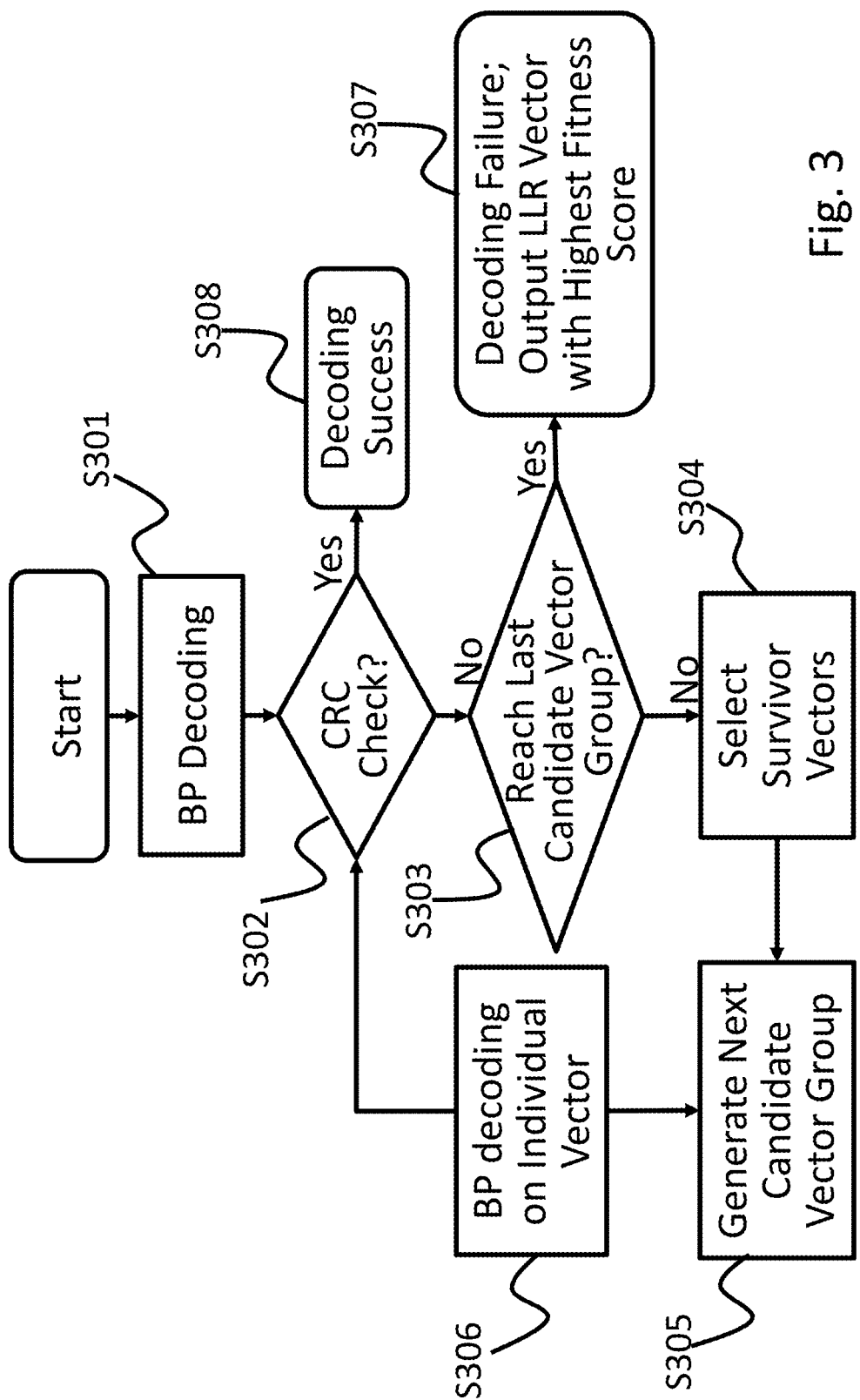
FIG. 3 is a flowchart of one embodiment of the invention.

According to the above premise, the invention is a method of decoding polar codes based on belief propagation, please refer to FIG. 3, (S301) to (S302) are steps of decoding polar codes using the traditional belief propagation (BP) decoding method. After a number of times of BP decoding iterations is reached and a decoding result still cannot pass the cyclic redundancy check (CRC), and the following steps will be performed:

(S303) confirming whether an upper limit (P) of a number of times of establishing a new candidate vector group is reached: when the upper limit (P) of the number of times has not been reached, proceeding to step (S304) of selecting a survivor vector group, when the upper limit (P) of the number of times is reached, proceeding to step (S307);

(S304) selecting the survivor vector group: retaining X log-likelihood ratio vectors from the log-likelihood ratio vectors generated in each of the iterations according to a fitness score, each of the retained log-likelihood ratio vectors is called a survivor vector herein, and all the survivor vectors are called the survivor vector group herein, X is a positive integer;

(S305) establishing the candidate vector group: deriving Y derivative vectors from the survivor vector group, the set of all derivative vectors are called the candidate vector group. Each candidate vector is used as the input value of subsequent belief propagation decoding. Wherein the method of deriving the candidate vector group from the survivor vector group at least includes mutation method and combination method, but actual implementation of the invention is not limited thereto. Any new R messages in leftmost column or new L messages in rightmost column generated by conditional LLR value manipulation (e.g., flipping sign and/or adjusting magnitude) or regrouping of the survivor vectors (i.e., the R messages ($R_{0,i}$) in leftmost column or the L messages ($L_{n,i}$) in rightmost column) are the derivative vectors referred to in the invention, and the mutation method and the combination method are described below in detail;

(S306) performing belief propagation decoding again: inputting the Y derivative vectors in the candidate vector group successively or parallelly to perform belief propagation decoding again, performing step (S302) of cyclic redundancy check for a decoding result, when the decoding result passes the cyclic redundancy check, that is, the decoding is successful (S308), otherwise, return to step (S303); and (S307) selecting the LLR vector with a highest fitness score in the all last BP iterations initialized with the derivative vectors in the last candidate vector group and outputting that LLR vector as a soft decoding result. In this scenario, it is considered that there is no chance to successfully decode an entire block of complete information at this time, and only a lower bit error rate can be pursued. The LLR vector with the highest fitness score has a higher probability of having fewer number of error bits, therefore, it is selected as a soft decoding output.

In (S304) of selecting the survivor vector group of the invention, for further example, if the number of iterations of the traditional belief propagation decoding is 10, then 10 LLR vectors will be generated in each of the stages in the factor graph (as shown in FIG. 2). When entering this step for the first time, survivor selection will be carried out according to the LLR vectors of the R messages ($R_{0,i}$) in leftmost column or the L messages ($L_{n,i}$) in rightmost column generated in the process of (S301). Further, as shown in FIG. 1, after each iteration, the R messages ($R_{0,i}$) in leftmost column or the L messages ($L_{n,i}$) in rightmost column each has 8 LLRs, which constitute an LLR vector in the present invention. According to the above, there are 10 LLR vectors generated after 10 iterations, then assume 5 LLR vectors are selected from the above 10 LLR vectors according to their fitness scores, then the above-mentioned 5 LLR vectors are called the survivor vectors.

Afterwards, the Y derivative vectors are generated from these survivor vectors and they comprise the first candidate vector group. To generate the p-th candidate vector group, the Y final LLR vectors at the end of Y independent belief propagation initialized with the Y derivative vectors in the (p−1)-th candidate vector group are first combined with the original X survivor vectors, and then X new survivor vectors are selected according to their fitness scores. The above examples do not limit the number of times of the BP iterations, the number of the survivor vectors, the number of the derivative vectors, or the number of new candidate vector groups generated when the present invention is actually implemented.

In one embodiment of the invention, in the step of selecting the survivor vectors, in addition to selecting the LLR vectors generated from each of the iterations in the current belief propagation process according to the fitness score, the X survivor vectors are further selected in a conditional manner, wherein the conditional selection method (or roulette method) is that those with a relatively low fitness score will have a higher probability of being eliminated, contrarily those with a higher fitness score will have a higher probability of being selected. However, the actual implementation of the invention is not limited thereto, and can also be other selection methods, such as random selection method.

In one embodiment of the invention, the step of deriving the Y derivative vectors by the X survivor vectors includes:

the combination method: combining the LLRs of different bit positions in any two or more than any two of the LLR survivor vectors to form the derivative vectors; or the mutation method: flipping signs or adjusting magnitude of at least one of the log-likelihood ratios of a certain survivor vector to form the derivative vectors.

A ratio of the above two methods (the combination method and the mutation method) can be adjusted to form a new candidate vector group, for example: 30% derivative vectors generated by the combination method plus 70% derivative vectors generated by the mutation method to form the new candidate vector group, or 80% derivative vectors generated by the combination method plus 20% derivative vectors generated by the mutation method to form the new candidate vector group. In each time, a number of the survivor vectors and a number of the derivative vectors have been set in advance. Wherein the fitness score of the survivor vector group has been calculated, and the derivative vectors have no fitness score yet, the fitness score will not be available until after step (S306).

As described above, the Y derivative vectors in (S305) that comprise the candidate vector group are derived from the survivor vectors in (S304). Wherein there are two types of embodiments for the mutation method as described before. The first type of embodiment uses the R messages in leftmost column in the factor graph as the LLR vectors. For a survivor LLR vector (e.g., R messages), at least one LLR performs the following operation to form a vector of updated R message (derivative LLR vector):

$$\hat{R}_{j=0,i} = \begin{cases} +\infty, & i \in \text{frozen bit} \\ (1-2u_i)b, & i \in \text{reliable bit} \\ (2u_i-1)b, & i \in \text{unreliable bit} \\ 0, & \text{otherwise} \end{cases} \quad (5)$$

wherein j represents a row index, i represents a column index, $\hat{R}_{0,i}$ represents the updated R messages (the derivative vector) after mutation in the invention, $u_i$ is hard decision (0 or 1) of the LLR value of the i-th bit of the R messages in leftmost column, and b is a preset constant. Wherein the reliable type refer to the set of a certain number of column indexes with a higher absolute value of LLR are selected from the R messages (the survivor vector) in leftmost column before mutation, and then a certain quantity of column indexes with a lower absolute value of LLR are selected as unreliable type. Conditions for the reliable and unreliable types can also be determined according to two threshold values. The column indexes with LLR absolute values higher than a first threshold value are the reliable type, and the column indexes with LLR absolute values lower than a second threshold value are the unreliable type, wherein the first threshold value and the second threshold value are preset absolute LLR values.

In the invention, the second type of embodiment of the mutation method uses the L messages in rightmost column in the factor graph as the LLR vectors, and changes the L messages ($L_{n,i}$) in the rightmost column according to at least one bit of a survivor vector (the L messages in rightmost column) to generate a new LLR vector (derivative vector). For example, at least one unreliable bit will be selected from a LLR vector (a survivor vector); the sign of the LLR values of the bits are flipped to generate a derivative LLR vector as follows:

$$\hat{L}_{j=n,i} = \begin{cases} \left(-\dfrac{L_{n,i}}{|L_{n,i}|}\right) \times b, & i \in \text{unreliable type} \\ L_{n,i}, & \text{otherwise} \end{cases} \quad (6)$$

This formula is used to modify the traditional formula (2), wherein ($L_{n,i}$) represents the original LLRs (L messages in rightmost column) from the channel, b is the preset constant. A plurality of bit positions is selected as the unreliable type according to the ranking on $|L_{n,i}+R_{n,i}|$. The LLR of the other positions remain unchanged. Since there are multiple ways to select a plurality of the bit positions and determine whether the bits are unreliable, a plurality of $L_{n,i}$ can be generated to construct a candidate vector group. The above examples do not limit the constant b, or the manner of how the unreliable bit positions are selected, or how many unreliable bit positions are selected in actual implementation of the invention.

The effectiveness of the above method depends on the number of actual bit errors in the LLR vector. Although the decoder cannot actually know this information, the fitness score can be used to approximate this value. The higher the classification accuracy of reliable/unreliable positions, the more effective reducing the influence of unreliable bits through the above-mentioned updating mechanism can help following belief propagation iteration, which can lead to likely successfully decoding. However, the LLR vectors with more erroneous bits will get a lower fitness score and they will gradually become extinct in the process of group update due to natural selection.

The method of generating the derivative vectors using the combination method is as follows:

In the first step, select a random number m from 1 to N (code length).

In the second step, using one of the survivor vectors as the father to provide the LLRs from 1 to m of the column index of the L (or R) messages, and using another survivor vector as the mother to provide the remaining LLRs (from m+1 to N) of the L (or R) messages, wherein N represents the code length of the polar code, and m represents a positive integer less than N. In other words, the derivative vector is generated by cascading information provided by the father and by the mother. This combination process allows exploration of completely new codeword space during the BP iteration, which cannot be achieved by the traditional propagation methods.

In the invention, the fitness score is the sum of absolute values of all the LLRs in a LLR vector, as $$\text{fitness} = \sum_{i=1}^{N} |LLR_i|$$

wherein fitness represents the fitness score, N represents the code length of the polar code. The higher the fitness score of an LLR vector, the higher the probability of successful decoding and the fewer remaining error bits.

In order to present the decoding performance of the invention, the following simulation results are provided.

1. The code length used is 1024 bits; the information bits to be transmitted are 512 bits; and the remaining 512 bits are frozen bits.

2. The following CRC (24 bits) is used $$x^{24}+x^{23}+x^{21}+x^{20}+x^{17}+x^{15}+x^{13}+x^{12}+x^{8}+x^{4}+x^{2}+x+1.$$

3. P is set to 50, and S is set to 20.

Figure 4:
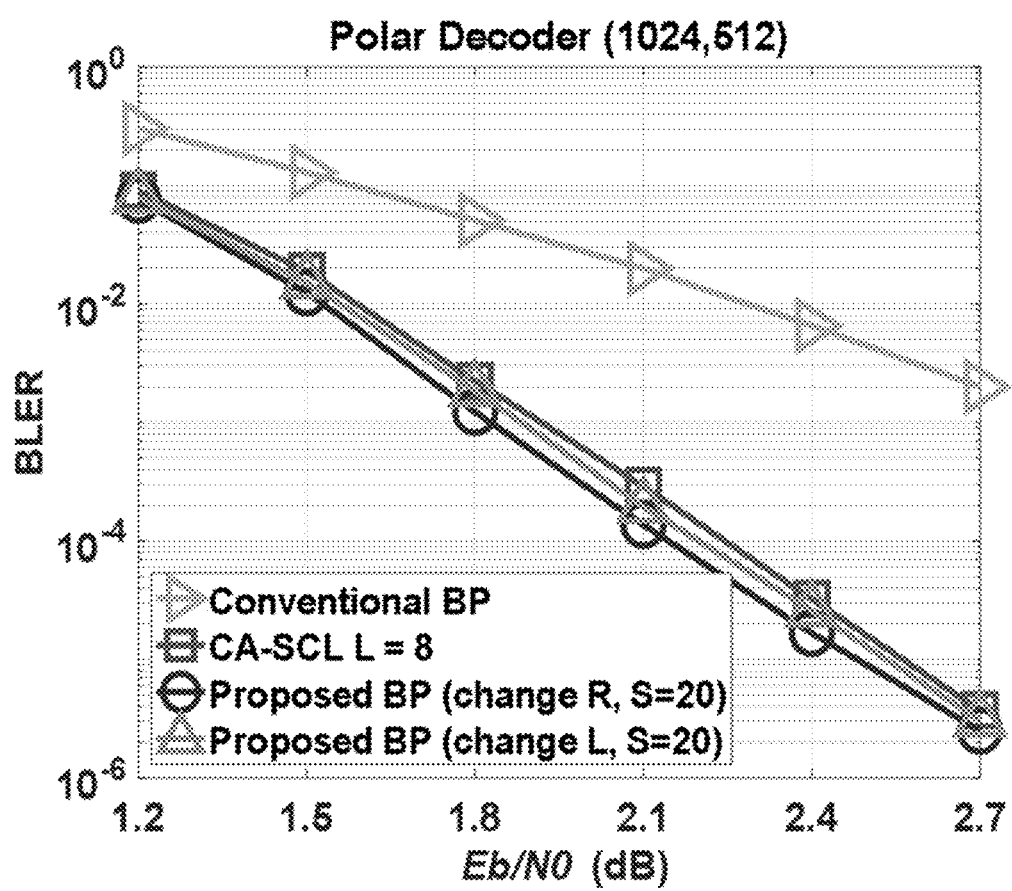
FIG. 4 is a graph of simulation results of the invention and other methods.

FIG. 4 depicts the block error rate (BLER) comparison plot of several different polar code decoders under several signal-to-noise ratios, wherein the proposed BP (change R) represents the first type of embodiment; proposed BP (change L) represents the second type of embodiment. It can be observed from the simulation results in FIG. 4 that for both types of the embodiments their BLER performance beat the traditional belief propagation and the CRC aided successive cancellation list (CA-SCL) with list size L=8.

To sum up, the invention is completely novel, has never been disclosed or applied in the past by similar inventions, and has the value of industrial usability with substantial enhancement of efficacy, and thus the patent application is filed in accordance with the law. However, this specification is only the description of the preferred embodiments and is not intended to be used to define the claims of the invention. All modifications and variations of the constituent elements based on the principles and techniques of the present invention shall be covered by the claims of the invention.

What is claimed is:

1. A method of decoding polar codes based on belief propagation, when the belief propagation decoding failing to decode a polar code, the decoding failure meaning that after a number of iterations, a decoding result being still incapable of passing a cyclic redundancy check (CRC), and at each iteration an log-likelihood ratio vector with the number of elements equal to the code length will be generated, and the method comprising:

selecting a survivor vector group, said selecting a survivor vector comprising selecting and retaining X log-likelihood ratio vectors from the log-likelihood ratio vectors of R messages in leftmost column or L messages in rightmost column generated in each of the iterations as retained log-likelihood ratio vectors, each of the retained log-likelihood ratio vectors being called a survivor vector, X being a positive integer, all the survivor vectors being called the survivor vector group;

generating a candidate vector group, said generating a candidate vector comprising deriving Y derivative candidate vectors from the survivor vector group, all the derivative candidate vectors being the candidate vector group, wherein each of the derivative candidate vectors is used as an input value of the corresponding R messages or L messages when performing the belief propagation decoding again; and performing belief propagation decoding, said performing belief propagation decoding comprising performing belief propagation decoding and cyclic redundancy check with the input value being used as an initial value, and when a decoding result passing the cyclic redundancy check, decoding being successful.

2. The method of decoding the polar codes based on belief propagation as claimed in claim 1, wherein said selecting the survivor vector group comprises selecting the log-likelihood ratio vector from the set of all the log-likelihood ratio vectors generated in each of the previous iterations according to the fitness score, wherein said selecting the survivor vector group starts from the log-likelihood ratio vector with a highest fitness score, wherein the fitness score is positively correlated with the performance of a decoding result.

3. The method of decoding the polar codes based on belief propagation as claimed in claim 2, wherein the fitness score of the log-likelihood ratio vector is a sum of absolute values of all the log-likelihood ratios in each of the log-likelihood ratio vectors, as shown in a formula below:

$$\text{fitness} = \sum_{i=1}^{n} |LLR_i|$$

wherein fitness represents the fitness score, N represents a decoded code length, the higher the fitness score of each of the log-likelihood ratio vectors, the higher the performance of decoding and the fewer the error bits.

4. The method of decoding the polar codes based on belief propagation as claimed in claim 1, wherein said deriving Y derivative candidate vectors from the survivor vector group is a combination method, and the combination method combines the log-likelihood ratios of different bit positions in any two or more than any two of the survivor vectors to form a derivative vectors.

5. The method of decoding the polar codes based on belief propagation as claimed in claim 1, wherein said deriving Y derivative candidate vectors is a mutation method, and the mutation method flips sign or adjust magnitude of the log-likelihood ratio of at least one bit of one of the survivor vectors to form the derivative vector.

6. The method of decoding the polar codes based on belief propagation as claimed in claim 1, wherein said deriving Y derivative candidate vectors from the survivor vector group is a combination method and a mutation method, the combination method combines the log-likelihood ratios of different bit positions in any two or more than any two of the survivor vectors to form the derivative vectors, the mutation method flips sign or adjust magnitude of the log-likelihood ratio of at least one bit of one of the survivor vectors to form a derivative vector, and the candidate vector group includes the derivative vector derived by the combination method and the mutation method.

7. The method of decoding the polar codes based on belief propagation as claimed in claim 1, wherein said performing belief propagation decoding comprises:
providing a limit of the number of belief propagation iterations;
using each of the derivative vectors of the candidate vector group as each of the initial values for belief propagation, when passing the cyclic redundancy check, decoding result being successful;
otherwise, confirming whether the limit of the number of iterations being reached;
when the limit of the number of iterations having not been reached, generating a new candidate vector group, and continuing to perform belief propagation decoding; and
when the limit of the number of iterations having been reached, selecting the log-likelihood ratio vector with a highest fitness score from all log-likelihood ratio vectors at the end of all belief propagation iterations as an output of soft decoding result.

8. The method of decoding the polar codes based on belief propagation as claimed in claim 4, wherein the combination method comprises:
selecting a random number m from 1 to N; and
using one of the survivor vectors of the survivor vector group as a father to provide the log-likelihood ratios of bit positions from 1 to m of a column index of the L (or R) messages, using another one of the survivor vectors of the survivor vector group as a mother to provide information of the remaining bit positions, that being, the log-likelihood ratios from m+1 to N of the L (or R) messages, N representing the code length of decoding, and m representing a positive integer less than N, meaning that the derivative vectors are formed by connecting part of the log-likelihood ratios provided by each of the different survivor vectors in series.

9. The method of decoding the polar codes based on belief propagation as claimed in claim 5, wherein the mutation method further comprises:
after each of the iterations, flipping the sign or adjusting the magnitude of at least one log-likelihood ratio of the survivor vector to form the derivative vector, which is called an updated right message, and the updated right message is defined as follows:

$$\hat{R}_{j=0,i} = \begin{cases} +\infty, & i?? \text{ frozen bit} \\ (1-2u_i)b, & i?? \text{ reliable bit} \\ (2u_i-1)b, & i?? \text{ unreliable bit} \\ 0, & \text{otherwise} \end{cases}$$

wherein j represents a row index, i represents a column index, $\hat{R}_{0,i}$ represents the derivative vector, $u_i$ is a hard decoding of the log-likelihood ratio vectors of the i-th bit of the R messages in leftmost column, the hard decoding value is 1 or 0, and b is a preset constant;
wherein a certain quantity of column indexes with higher absolute values of log-likelihood ratios are selected from the survivor vectors to be a reliable type in the above formula, and a certain quantity of column indexes with lower absolute values of log-likelihood ratios are selected from the survivor vectors to be an unreliable type in the above formula; and
wherein classification conditions for the reliable type or the unreliable type can also be determined according to two threshold values, the column indexes with absolute values of log-likelihood ratios higher than a first threshold value are the reliable type, and the column indexes with absolute values of log-likelihood ratios lower than a second threshold value are the unreliable type, wherein the first threshold value and the second threshold value are preset absolute values of the log-likelihood ratios.

10. The method of decoding the polar codes based on belief propagation as claimed in claim 5, wherein the mutation method comprises:
changing at least one bit position of the survivor vector to generate the derivative vector, further, selecting at least one unreliable bit position from the survivor vector, and flipping signs and/or adjusting magnitude of a log-likelihood ratio value of the bit position to generate the derivative vector, and this step is defined as follows:

$$\hat{L}_{j=n,i} = \begin{cases} \left(-\dfrac{L_{n,i}}{|L_{n,i}|}\right) \times b, & i \in \text{unreliable type} \\ L_{n,i}, & \text{otherwise} \end{cases}$$

wherein $L_{n,i}$ is the original log-likelihood ratios from the channels, b is the preset constant, a certain quantity of bit positions are selected to be regarded as the unreliable type according to a sorting result of $|L_{n,i}+R_{n,i}|$, and the remaining bit positions are the same as the original, thereby a plurality of sets of $L_{n,i}$ are generated to establish the candidate vector group.

11. The method of decoding the polar codes based on belief propagation as claimed in claim 3, wherein in selecting the survivor vector group, in addition to selecting the log-likelihood ratio vectors generated from each of the iterations in the belief propagation decoding according to the fitness score, the X survivor vectors are further selected in a conditional manner, wherein the conditional selecting method is that those with a relatively low fitness score have a higher probability of being eliminated, contrarily those with a higher fitness score have a higher probability of being selected.

* * * * *